US012586889B2

(12) United States Patent
Chen et al.

(10) Patent No.: US 12,586,889 B2
(45) Date of Patent: Mar. 24, 2026

(54) CONVERSION APPARATUS FROM CHIP PACKAGE TO WAVEGUIDE, RADIO FREQUENCY APPARATUS AND RADAR APPARATUS

(71) Applicant: CALTERAH SEMICONDUCTOR TECHNOLOGY (SHANGHAI) CO., LTD, Shanghai (CN)

(72) Inventors: Zhefan Chen, Shanghai (CN); Dian Wang, Shanghai (CN); Kaijie Zhuang, Shanghai (CN); Xuejuan Huang, Shanghai (CN); Shan Li, Shanghai (CN); Chenwu Yu, Shanghai (CN)

(73) Assignee: CALTERAH SEMICONDUCTOR TECHNOLOGY (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 19/005,548

(22) Filed: Dec. 30, 2024

(65) Prior Publication Data

US 2025/0132483 A1 Apr. 24, 2025

Related U.S. Application Data

(63) Continuation of application No. PCT/CN2023/143541, filed on Dec. 29, 2023.

(30) Foreign Application Priority Data

Sep. 28, 2023 (CN) .......................... 202311284003.8

(51) Int. Cl.
*H01P 5/107* (2006.01)
*H01L 23/552* (2006.01)
(Continued)

(52) U.S. Cl.
CPC ............ *H01P 5/107* (2013.01); *H01L 23/552* (2013.01); *H01L 23/66* (2013.01); *H01P 3/081* (2013.01)

(58) Field of Classification Search
CPC ............ H01P 5/107; H01P 3/081; H01P 5/08; H01L 23/552; H01L 23/66; H01Q 1/32; H01Q 1/38; H05K 1/18
(Continued)

(56) References Cited

U.S. PATENT DOCUMENTS

| | | | |
|---|---|---|---|
| 10,033,081 B2 | 7/2018 | Dang et al. | |
| 11,196,146 B2 | 12/2021 | Moallem et al. | |

(Continued)

FOREIGN PATENT DOCUMENTS

| | | |
|---|---|---|
| CN | 102144289 A | 8/2011 |
| CN | 105680133 A | 6/2016 |

(Continued)

OTHER PUBLICATIONS

CNIPA Notification to Grant Patent Right for Invention in CN Application No. 202311284003.8 dated Sep. 8, 2025 (7 pages, including English translation of Notification with granted claims attached).

*Primary Examiner* — Jorge L Salazar, Jr.
(74) *Attorney, Agent, or Firm* — BROOKS KUSHMAN P.C.

(57) ABSTRACT

The present application discloses a conversion apparatus from a chip package to a waveguide, a radio frequency apparatus and a radar apparatus. The conversion apparatus includes: a first metal layer as a metal ground layer, a second metal layer, a third metal layer, a shielding metallization via, a conversion via, and a dielectric substrate disposed between different metal layers to function as a support; the second metal layer is configured to lay an RF trace; the third metal layer is configured to dispose a patch element; a capacitance formed between the RF trace and patch element introduces capacitance characteristic; multiple shielding metallization vias are ground vias around the patch element and RF trace for guiding RF signal propagation; at least one conversion metallization via is disposed on one end of the RF trace close to the patch element, for connecting the RF trace and patch element and introducing inductance characteristic.

20 Claims, 6 Drawing Sheets

(51) Int. Cl.
    *H01L 23/66*        (2006.01)
    *H01P 3/08*         (2006.01)

(58) Field of Classification Search
    USPC ................................. 333/24 R, 26, 239, 247
    See application file for complete search history.

(56) References Cited

U.S. PATENT DOCUMENTS

| | | | |
|---|---|---|---|
| 2013/0127563 | A1 | 5/2013 | Gritters et al. |
| 2020/0365971 | A1* | 11/2020 | Moallem ................ H01Q 13/06 |
| 2022/0415830 | A1 | 12/2022 | Erdoel et al. |

FOREIGN PATENT DOCUMENTS

| | | | |
|---|---|---|---|
| CN | 107431064 | A | 12/2017 |
| CN | 108987866 | A | 12/2018 |
| CN | 110800155 | A | 2/2020 |
| CN | 111123431 | A | 5/2020 |
| CN | 113812044 | A | 12/2021 |
| CN | 114284674 | A | 4/2022 |
| CN | 114334919 | A | 4/2022 |
| CN | 114709579 | A | 7/2022 |
| CN | 217719918 | U | 11/2022 |
| CN | 116190959 | A | 5/2023 |
| CN | 116454622 | A | 7/2023 |
| CN | 116779557 | A | 9/2023 |
| CN | 221125931 | U | 6/2024 |
| KR | 1020140143990 | A | 12/2014 |
| WO | 2022184835 | A1 | 9/2022 |
| WO | 2023215263 | A1 | 11/2023 |

* cited by examiner

CONVERSION APPARATUS FROM CHIP PACKAGE TO WAVEGUIDE, RADIO FREQUENCY APPARATUS AND RADAR APPARATUS

CROSS-REFERENCE TO RELATED APPLICATIONS

This application is a continuation of International PCT Application No. PCT/CN2023/143541, filed on Dec. 29, 2023, which claims the priority to Chinese Patent Application No. 202311284003.8, filed on Sep. 28, 2023, the disclosures of which are hereby incorporated herein by reference in their entireties.

TECHNICAL FIELD

The present application relates to, but is not limited to, semiconductor radio frequency technology, particularly a conversion apparatus from a chip package to a waveguide, a radio frequency apparatus and a radar apparatus.

BACKGROUND

Conversion of a radio frequency signal from a chip package to an external structure is a complex technology. A radio frequency signal from a chip die first enters a package of the chip, and then is converted to an external waveguide/microstrip line/coaxial line or another transmission structure through a connection structure. An air waveguide is a structure used to transmit an electromagnetic wave, may be a hollow metal tube or a dielectric tube, and is used to guide propagation of a microwave, a millimeter wave or an optical wave. The air waveguide has a low loss, a wide impedance bandwidth, and is easy to connect and integrate with other modules. Based on the above advantages, it is a necessary technology in engineering to convert a radio frequency signal of a chip into the air waveguide.

To achieve this technology, the following issues need to be considered: what kind of structure is used to convert the radio frequency (RF) signal in the chip package into an external waveguide, which can achieve a low loss, a wide impedance bandwidth characteristic, etc. This is a technical problem that needs to be solved urgently.

SUMMARY

The present application provides a conversion apparatus from a chip package to a waveguide, a radio frequency apparatus, and a radar apparatus, which are simple in structure and can ensure RF performance of a transition structure from the chip package to the waveguide.

An embodiment of the present invention provides a conversion apparatus from a chip package to a waveguide, including: a first metal layer as a metal ground layer, a second metal layer, a third metal layer, a shielding metallization via, a conversion via, and a dielectric substrate disposed between different metal layers to function as a support.

The second metal layer is configured to lay a radio frequency (RF) trace.

The third metal layer is configured to dispose a patch element; a capacitance formed between the RF trace on the second metal layer and the patch element on the third metal layer introduces a capacitance characteristic.

A plurality of shielding metallization vias is ground vias around the patch element and the RF trace for guiding RF signal propagation.

At least one conversion metallization via is disposed on one end of the RF trace close to the patch element, for connecting the RF trace and the patch element and introducing an inductance characteristic.

In an exemplary example, the conversion apparatus further includes a connection structure connecting the chip package and a waveguide structure, the connection structure encloses a waveguide cavity around the patch element.

An RF signal of a chip is converted into the waveguide structure through the radio frequency (RF) trace and the patch element and the waveguide cavity.

In an exemplary example, the connection structure is a ball grid array (BGA) solder ball, or a connection structure made of a material of which a surface is metal.

In an exemplary example, the waveguide structure is provided with an inner cavity, and the inner cavity is rectangular, or elliptical, or circular, or ridge-shaped.

In an exemplary example, the RF trace is a substrate integrated waveguide (SIW), or a microstrip line, or a stripline, or a coplanar waveguide.

In an exemplary example, the RF trace is a single branch trace or a multi-branch trace.

One end of each branch close to the patch element is provided with one conversion metallization via.

In an exemplary example, the RF trace is a single branch trace; and the single branch trace is a half Y-shaped single branch trace.

Or the RF trace is a multi-branch trace; the multi-branch trace is a symmetrical fork-shaped three-branch trace.

In an exemplary example, a projection of the RF trace on the third metal layer is at least partially overlapped with the patch element.

In an exemplary example, an overlapping length of the projection of the RF trace on the third metal layer and the patch element is sufficiently long to enable a resonance circuit formed by the capacitance formed between the RF trace and the patch element and an inductance introduced by the conversion metallization via to constitute a broadband resonant structure.

In an exemplary example, the overlapping length is greater than or equal to one third of a length of the patch element.

In an exemplary example, the RF trace is symmetrically fed, or asymmetrically fed.

In an exemplary example, the patch element includes a rectangular patch.

In an exemplary example, the connection structure includes a plurality of solder balls arranged around a circumference of the patch element, and the plurality of solder balls forms a waveguide cavity for the patch element to transmit a signal; and an inner ring enclosed by the plurality of solder balls includes at least one ridge portion protruding inwards.

In an exemplary example, the inner ring is a rectangular inner ring provided with the ridge portion within the inner.

In an exemplary example, a quantity of the ridge portion is one; and the ridge portion is located in a middle of one side of the rectangular inner ring.

In an exemplary example, a quantity of the ridge portion is one; the ridge portion is located in a corner of the rectangular inner ring.

In an exemplary example, a quantity of the ridge portions is two; and the two ridge portions are respectively located in middles of two opposite sides of the rectangular inner ring.

In an exemplary example, a quantity of the ridge portions is two; and the two ridge portions are respectively located on two opposite corners of the rectangular inner ring.

In an exemplary example, the inner ring is a circular ring or an elliptical ring having the ridge portion therein.

The conversion apparatus from the chip package to the waveguide provided by the embodiment of the present application is a transition structure from the chip package to the waveguide with a simple structure, low loss, and wide impedance bandwidth, which avoids the problem of frequency offset caused by the processing error of the slit in the E-shaped patch, thus ensuring the characteristics of broadband and low loss.

An embodiment of the present application further provides a radio frequency apparatus, including: a package body with an IC die, and a PCB board; wherein the package body further includes conversion apparatus from the chip package to the waveguide described in any one of the above items; and the PCB board is provided with a waveguide structure.

An RF signal from the IC die is converted into the waveguide structure through the patch element in the conversion apparatus.

In an exemplary example, a waveguide aperture is further provided on the PCB board corresponding to the patch element in the conversion apparatus, and signal transmission from the IC die to the waveguide aperture is implemented through the RF trace and the patch element in the conversion apparatus.

In an exemplary example, a cross-sectional shape of the waveguide aperture is the same as a shape of an inner ring enclosed by a plurality of solder balls around the patch element; and the package body is mounted on the PCB board, and a plurality of solder balls is arranged in a ring around a boundary of the waveguide aperture.

An embodiment of the present application further provides a radar apparatus including the radio frequency apparatus described in any one of the above items; an antenna structure electrically connected to the radio frequency apparatus.

Other features and advantages of the present invention will be set forth in the description below, and in part will become apparent from the specification, or may be learned by practice the present invention. Purposes and other advantages of the present invention can be achieved and obtained by structures specifically pointed out in the specification, claims and drawings.

BRIEF DESCRIPTION OF THE DRAWINGS

Accompanying drawings are used to provide a further understanding of technical solutions of the present application, form a part of the specification, and are used to explain the technical solutions of the present application together with the embodiments of the present application and are not intended to form limitations on the technical solutions of the present application.

DETAILED DESCRIPTION

In order to make purposes, technical solutions and advantages of the present application clearer, the embodiments of the present application will be described in detail below with reference to the accompanying drawings. It should be noted that the embodiments of the present application and the features in the embodiments can be combined with each other arbitrarily without a conflict.

In order to facilitate understanding of the present application, the present application will be described more completely below with reference to the accompanying drawings. Embodiments of the present application are shown in the accompanying drawings. However, the present application may be implemented in many different forms and is not limited to the embodiments described herein. Rather, these embodiments are provided for the purpose of making contents disclosed by the present application more thorough and comprehensive.

Unless otherwise defined, all technical and scientific terms used herein have the same meaning as that commonly understood by those skilled in the art belonging to the present application. The terms used herein in the specification of the present application is for the purpose of describing specific embodiments only, and is not intended to limit the present application.

It may be understood that the terms "first" and "second" used in the present application are for descriptive purposes only and cannot be understood as indicating or implying relative importance or implicitly indicating the quantity of technical features indicated. Thus, a feature defined as "first", "second" may explicitly or implicitly includes at least one of the features. In the description of the present application, "a plurality" means at least two, for example, two, three, etc. unless otherwise explicitly and specifically defined.

It can be understood that "connection" in the following embodiments should be understood as "electrical connection", "communication connection", or the like if connected circuits, modules, units, and the like have electrical signals or data transmission to each other.

As used herein, the singular forms "a", "one", and "the/ said" may also include plural forms unless the context clearly dictates otherwise. It should also be understood that the terms "including/comprising" or "having" and the like specify the presence of the stated features, integers, steps, operations, components, portions, or combinations thereof, but do not exclude the possibility of the presence or addition of one or more other features, integers, steps, operations, components, portions, or combinations thereof. Meanwhile, the term "and/or" as used in this specification includes any and all combinations of relevant listed items.

Figure 1A:
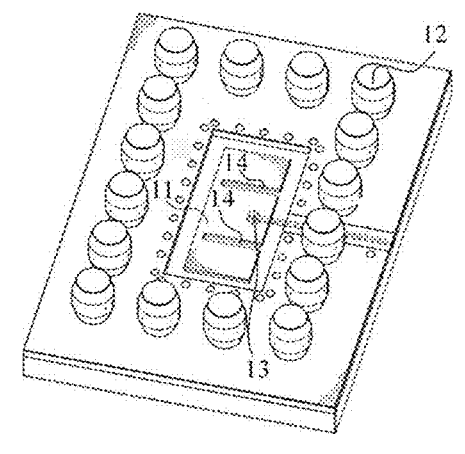
FIG. 1A is an oblique top view of a constituent structure of a conversion structure for transition from a chip package to a waveguide.
Figure 1B:
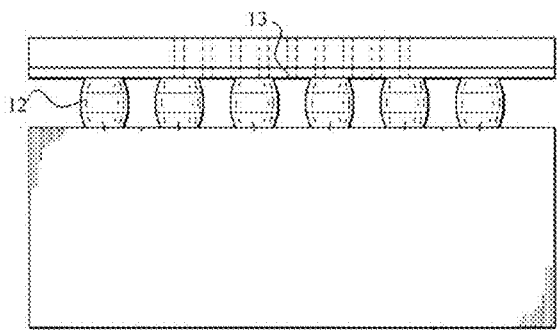
FIG. 1B is a front view of a constituent structure of a conversion structure for transition from a chip package to a waveguide.

FIG. 1A is an oblique top view of a constituent structure of a conversion structure for transition from a chip package to a waveguide, and FIG. 1B is a front view thereof. In combination with FIG. 1A and FIG. 1B, in a chip package, an RF transmission line pass through an E-shaped Patch 11, through a cavity enclosed by solder balls 12, and convert an RF signal from this cavity into a rectangular waveguide. In the E-shaped patch 11, a slit 14 provides a capacitance characteristic, and a metallization hole 13 on the E-shaped patch 11 (connecting the RF transmission line and the E-shaped patch 11) provides an inductance characteristic, and an equivalent resonance circuit of the capacitance and inductance constitutes a broadband resonance structure. However, in the transition structure shown in FIGS. 1A and 1B, limited by a processing accuracy of the slit 14 in the E-shaped patch 11, frequency offset may occur, and the resonance frequency is sensitive to a length and width of the slit 14 in the conversion structure, so that an RF performance of the conversion structure for transition from the chip package to the waveguide shown in FIGS. 1A and 1B may be deteriorated.

Figure 2A:
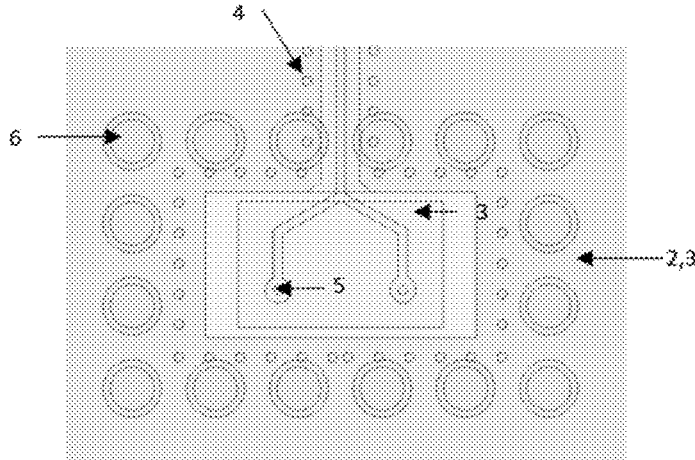
FIG. 2A is a top view of a constituent structure of a conversion apparatus for transition from a chip package to a waveguide according to an embodiment of the present application.
Figure 2B:
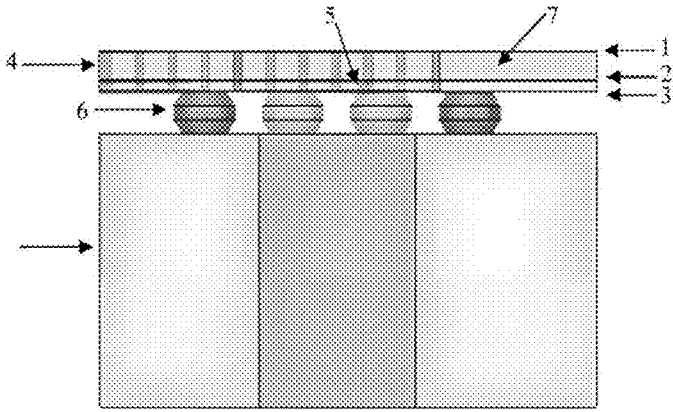
FIG. 2B is a front view of a constituent structure of a conversion apparatus for transition from a chip package to a waveguide according to an embodiment of the present application.

In order to ensure the RF performance of the conversion structure for transition from the chip package to the waveguide, an embodiment of the present application provides a conversion apparatus from a chip package to a waveguide, as shown in FIG. 2A and FIG. 2B, which may include: a first metal layer 1, a second metal layer 2, a third metal layer 3, a shielding metallization via 4, a conversion via 5, a connection structure 6, and a dielectric substrate 7 provided between different metal layers to function as a support.

The first metal layer 1 is a metal ground layer. In one embodiment, the first metal layer 1 is entirely metal and is used as a reference ground for the third metal layer 3.

The second metal layer 2 is disposed below the first metal layer 1, and the second metal layer 2 is configured to lay an RF trace, such as an exemplary Y-shaped trace in FIG. 2A. A capacitance characteristic is introduced by a capacitance formed between the RF trace on the second metal layer 2 and a patch element on the third metal layer 3. In one embodiment, an RF reference ground is provided around the RF trace. In the embodiment of the present application, a structure between the RF trace on the second metal layer and the patch element on the third metal layer 3 is provided, which is different from a slit made to provide capacitance characteristic in an E-shaped patch structure.

The third metal layer 3 is disposed below the second metal layer 2, and the third metal layer 3 is configured to dispose the patch element. In one embodiment, an RF reference ground is provided around the patch element.

A plurality of shielding metallization vias 4 are disposed between the first metal layer 1 and the third metal layer 3 and are around the patch element and the RF trace. The plurality of shielding metallization vias 4 are ground vias around the patch element and RF trace for guiding RF signal propagation and preventing leakage.

At least one conversion metallization via 5 is provided on an end of the RF trace close to the patch element, is between the second metal layer 2 and the third metal layer 3, and is configured to connect the RF trace and the patch element and introduce an inductance characteristic.

In the conversion apparatus from the chip package to the waveguide provided by the embodiment of the present application, on one hand, through an capacitance characteristic is formed between the RF trace disposed on the second metal layer 2 and the patch element disposed on the third metal layer 3, the structure that provides an capacitance characteristic through the slit in the E-shaped patch structure shown in FIG. 1A and FIG. 1B is replaced; on the other hand, an inductance characteristic of the conversion structure is introduced through the conversion metallization via 5 disposed between the second metal layer 2 and the third metal layer 3, and an equivalent circuit of the capacitance characteristic and the inductance characteristic constitutes a broadband resonance structure. The conversion apparatus from the chip package to the waveguide provided by an embodiment of the present application is a transition structure from a chip package to a waveguide with a simple structure, low loss, and wide impedance bandwidth, which avoids the problem that frequency offset may occur due to the processing accuracy of the slit in the E-shaped patch 11, and ensures characteristics of broadband and low loss.

In an embodiment of the present application, the first metal layer 1, the second metal layer 2, the third metal layer 3, the shielding metallization via 4, the conversion metallization via 5 and the dielectric substrate 7 constitute a package structure or are a part of the package structure. In an exemplary example, the conversion apparatus from the chip package to the waveguide provided by the embodiment of the present application can convert the RF signal from the chip through the RF trace on the second metal layer 2 into the waveguide structure 8 using a waveguide cavity surrounded by the connection structure 6. In one embodiment, the patch element disposed on the third metal layer 3 acts as a signal conversion apparatus, receives a signal transmitted from the chip to the RF trace, converts the signal to the waveguide structure 8, or receives a signal from the waveguide structure 8, converts the signal into the RF trace, and the signal is finally received by a chip internal.

In one exemplary example, the connection structure 6 may be a Ball Grid Array (BGA) solder ball, or a connection structure made of a material of which a surface is metal.

In one exemplary example, the waveguide structure 8 is provided with a waveguide cavity, which may be rectangular, or elliptical, or circular, or ridge-shaped. In one embodiment, the waveguide structure 8 may be a PCB with a waveguide aperture, an all-metal waveguide, or a plastic waveguide with a metallized surface. The waveguide structure 8 and the chip package are located on two sides of the conversion apparatus provided by the embodiment of the present application.

In an exemplary example, the RF trace may include, but are not limited to, traces such as a Substrate Integrated Waveguide (SIW), a Microstrip line (Microstrip), or a Stripline, or a coplanar waveguide.

In one exemplary example, the RF trace in the transmission line conversion may be a single branch trace or a multi-branch trace.

Figure 3A:
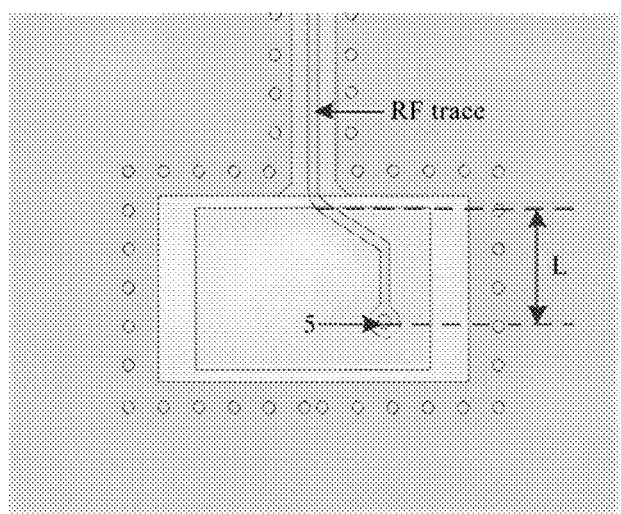
FIG. 3A is a schematic diagram of a form of an RF trace according to an embodiment of the present application.
Figure 3B:
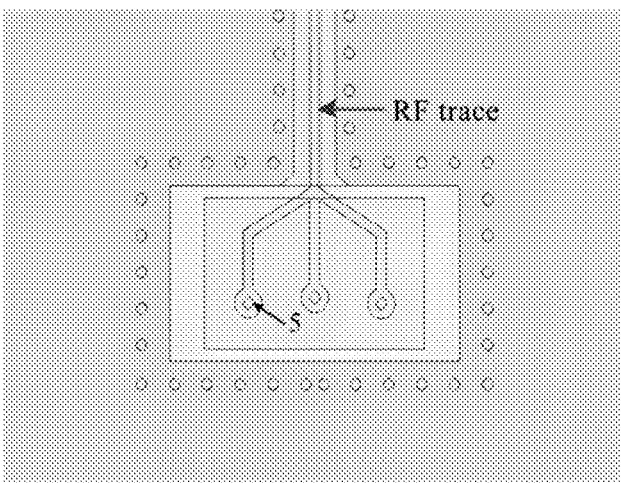
FIG. 3B is a schematic diagram of another form of an RF trace according to an embodiment of the present application.
Figure 3C:
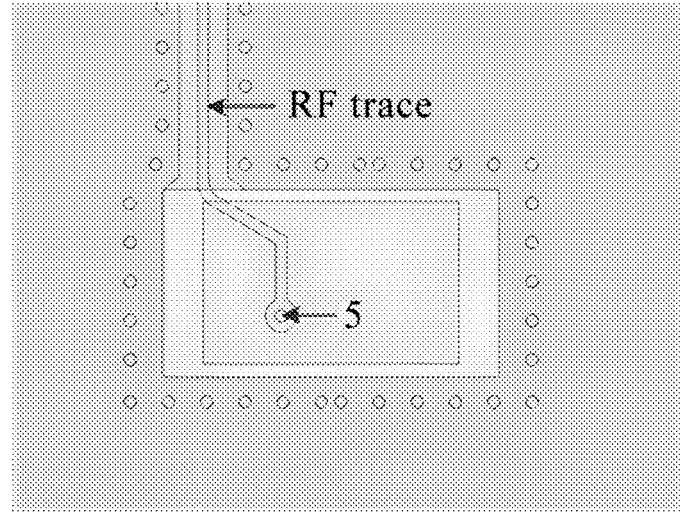
FIG. 3C is a schematic diagram of yet another form of an RF trace in an embodiment of the present application.

In one embodiment, as shown in FIGS. 3A and 3C, the RF trace is an exemplary half Y-shaped single branch trace, and a conversion metallization via 5 is provided at one end of the branch close to the patch element. In some embodiments, a single branch RF trace may be a straight trace, or a bending trace of another form.

In one embodiment, as shown in FIG. 3B, the RF trace is an exemplary symmetrical fork-shaped, including three branches, each of branches is provided with a conversion metallization via 5 at one end close to the patch element. Compared with the single branch RF trace, the multi-branch symmetrical RF trace has a better transmission efficiency.

In an exemplary example, a projection of the RF trace on the third metal layer 3 is at least partially overlapped with the patch element, so that a capacitance is formed between the patch element and the RF trace to introduce a capacitive characteristic. In one embodiment, as shown in FIG. 3B, an overlapping length L of the projection of the RF trace on the third metal layer 3 and the patch element should be sufficiently long, so that a resonance circuit formed by the capacitance formed between the RF trace and the patch element and an inductance introduced by the conversion metallization via 5 can constitute a broadband resonant structure. In one embodiment, the overlapping length L may be greater than or equal to one third of a length of the patch element. It should be noted that the length of the patch element refers to a length of the patch element in an extension direction of the RF trace.

In one embodiment, the RF trace may be symmetrically fed or asymmetrically fed.

In an exemplary example, the patch element disposed on the third metal layer 3 may include, but are not limited to, a rectangular patch.

In one exemplary example, the dielectric substrates 7 between different metal layers may be different dielectric substrates.

Figure 4:
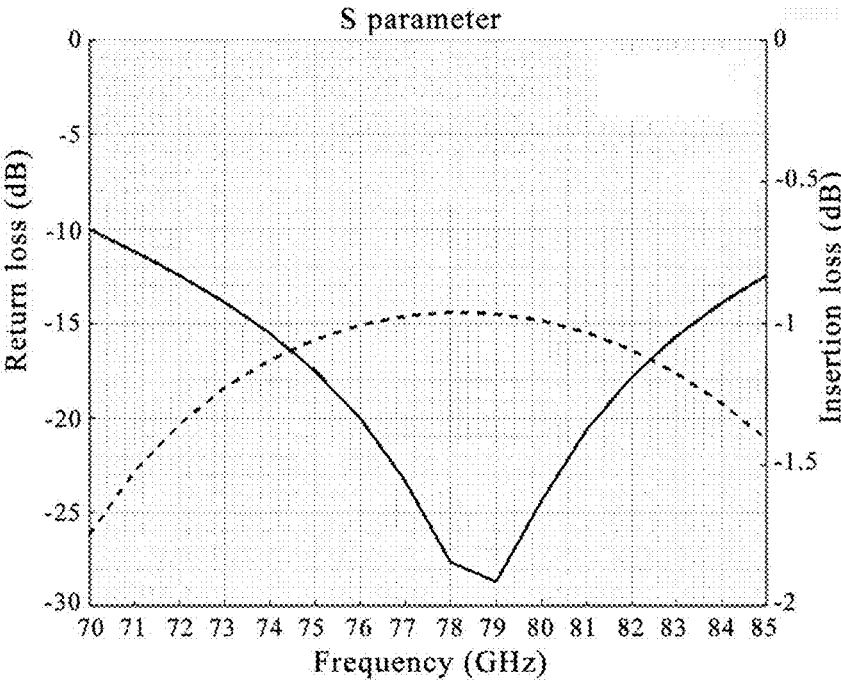
FIG. 4 is a schematic diagram of a RF performance result of a conversion apparatus from a chip package to a waveguide according to an embodiment of the present application.

FIG. 4 is a schematic diagram of an RF performance result of a conversion apparatus from a chip package to a waveguide according to an embodiment of the present application. As shown in FIG. 4, an abscissa represents frequency (unit is GHz), a left ordinate represents a return loss (unit is dB), and a right ordinate represents an insertion loss (unit is dB). FIG. 4 shows return loss and insertion loss in the frequency range from 70 GHz to 85 GHZ, where a solid curve represents a return loss curve, and a dashed curve represents an insertion loss curve. The curves shown in FIG. 4 show RF performance of a transition structure from the chip package to the waveguide in a vehicle millimeter-wave radar frequency band. A high transmission efficiency, low loss, and wide bandwidth in the entire frequency band are achieved, and RF performance is ensured.

Figures 5, 6, 7, 8:
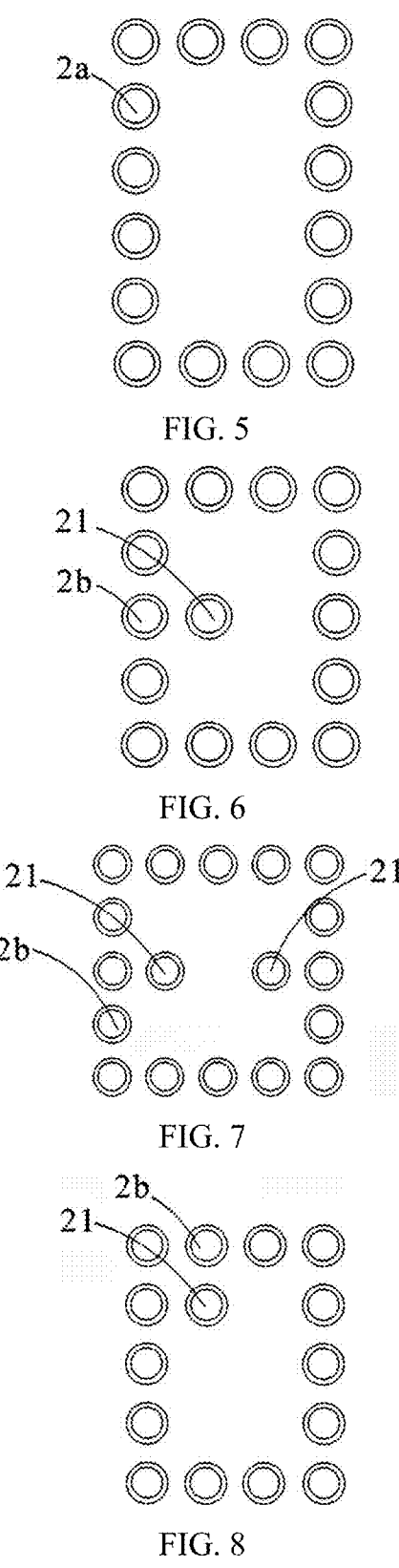
FIG. 5 is a schematic top view of a first arrangement of a plurality of solder balls according to an embodiment of the present application.
FIG. 6 is a schematic top view of a second arrangement of a plurality of solder balls according to an embodiment of the present application.
FIG. 7 is a schematic top view of a third arrangement of a plurality of solder balls according to an embodiment of the present application.
FIG. 8 is a schematic top view of a fourth arrangement of a plurality of solder balls according to an embodiment of the present application.

In an exemplary example, the connection structure includes a plurality of solder balls arranged around a circumference of the patch element, and the plurality of solder balls forms a waveguide cavity for the patch element to transmit a signal. In one embodiment, as shown in FIG. 5, the plurality of solder balls 2a encloses a rectangular inner ring. In some other embodiments, the plurality of solder balls 2a may enclose a circular inner ring, a polygonal inner ring, or an inner ring of other shapes, and a quantity of solder balls 2a may be adjusted according to the situation, which are not limited here.

In an exemplary embodiment, in order to further reduce an area occupied by the package transition structure, the inner ring enclosed by the plurality of solder balls includes at least one ridge portion protruding inwards, so that the plurality of solder balls are arranged in a ridge shape, where each ridge portion may be consists of one or more solder balls. In one embodiment, as shown in FIG. 6, the ridge 21 consists of one solder ball 2b.

Since the inner ring enclosed by the plurality of solder balls 2b is provided with a ridge portion protruding inwards, a cavity enclosed by the plurality of solder balls 2b forms a ridge-shaped waveguide cavity. The ridge-shaped waveguide cavity can be understood as bending a rectangular waveguide cavity inwards the cavity, and after bending, a length of a longest side of the cavity is unchanged, so transmission performance is unchanged, but after the cavity is bent, an area occupied by the cavity can be reduced, and a quantity of solder balls around the cavity can be reduced, which ensures that performance will not be degraded when a plurality of solder balls are used for a patch element to transmit signals.

In one embodiment, as the solder ball arrangement shown in FIG. 6, a plurality of solder balls 2b are arranged as a rectangular inner ring, since the ridge portion 21 is provided in the rectangular inner cavity, this cavity structure forms a ridge waveguide structure, which reduces a cutoff frequency of the waveguide cavity formed by the solder balls. Due to the reduction of the cutoff frequency, a long side of the waveguide cavity enclosed by solder balls can be shortened while ensuring the transmission performance. Compared with the arrangement of the rectangular cavity which the solder balls are formed in FIG. 5, the ridge-shaped waveguide structure enclosed by the plurality of solder balls 2b in FIG. 6 reduces an overall occupied area of the solder balls. The arrangement of solder balls in FIG. 6 ensures that when the plurality of solder balls 2b is used for the patch element to transmit signals, the performance will not be degraded.

In an exemplary example, only one ridge portion 21 is provided on a rectangular inner ring enclosed by the plurality of solder balls 2b, and an arrangement position of the ridge portion 21 may be adjusted according to specific needs. In one embodiment, as shown in FIG. 6, the ridge portion 21 is located at a middle position of one side of the rectangular inner ring, or as shown in FIG. 8, the ridge portion 21 may be located at a corner of the rectangular inner ring.

Figure 9:
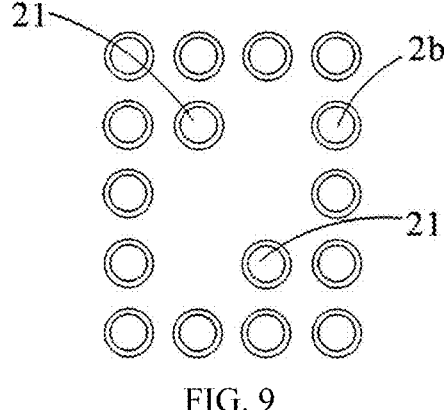
FIG. 9 is a schematic top view of a fifth arrangement of a plurality of solder balls according to an embodiment of the present application.

In an exemplary example, a plurality of ridges 21 may be provided on the rectangular inner ring enclosed by a plurality of solder balls 2b, and a quantity and an arrangement position of the ridges 21 may be adjusted according to specific needs. In one embodiment, as shown in FIG. 7, a rectangular inner ring is provided with two ridges 21, and the two ridges 21 are respectively located at middle positions of two opposite sides. In one embodiment, also as shown in FIG. 9, a rectangular inner ring may be provided with two ridges 21, and the ridges are respectively located at two opposite corners.

An embodiment of the present application further provides a radio frequency apparatus, which at least includes: a package body with an IC die, and a PCB board.

The package body further includes a conversion apparatus from the chip package to the waveguide according to any one of the embodiments of the present application, and a waveguide structure is disposed on the PCB board. An RF signal from the IC die is converted into the waveguide structure through the patch element in the conversion apparatus.

In an exemplary example, the waveguide structure is a waveguide aperture provided on the PCB board and corresponding to a patch element in the conversion apparatus in a one-to-one correspondence. Signal transmission from the IC die to the waveguide aperture is implemented through an RF trace, a patch element, and a waveguide cavity enclosed by a plurality of solder balls in the conversion apparatus.

In an exemplary example, a cross-sectional shape of the waveguide aperture is the same as a shape of a cavity enclosed by a plurality of solder balls around the patch element; The package body is mounted on the PCB board, and a plurality of solder balls are arranged around a circumference of a boundary of the waveguide aperture, so as to ensure that a signal is successfully transmitted from the waveguide cavity enclosed by the solder balls to the waveguide aperture, which is beneficial to reducing signal transmission loss and improving a signal transmission efficiency.

Figure 10:
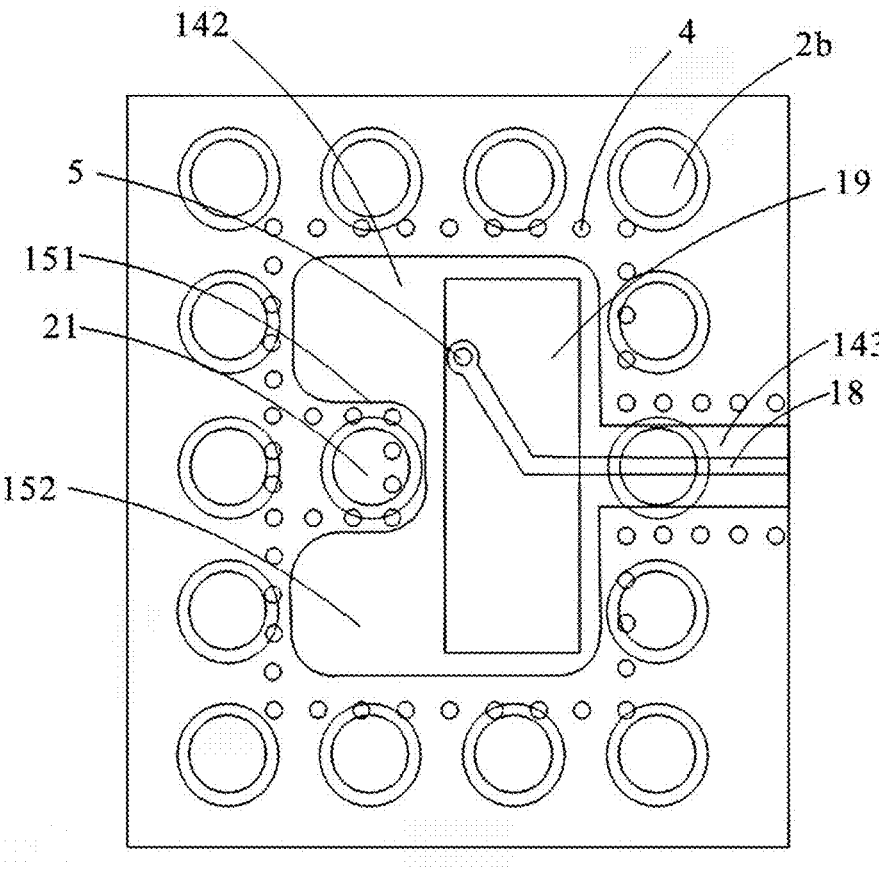
FIG. 10 is a top perspective view of a radio frequency apparatus according to an embodiment of the present application.
Figure 11:
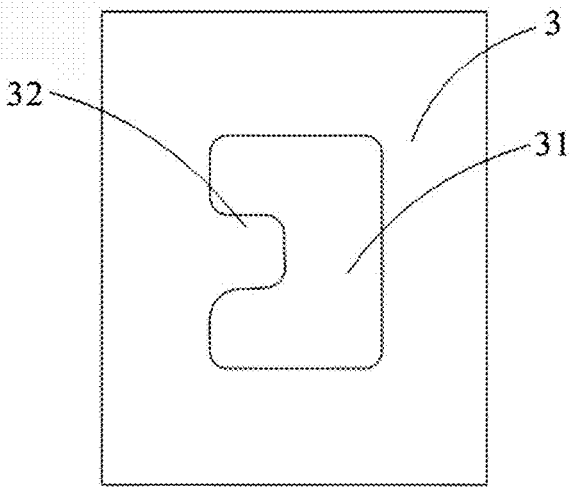
FIG. 11 is a schematic top view of a PCB board according to an embodiment of the present application.

FIG. 10 shows an example in which an inner ring enclosed by a plurality of solder balls includes a ridge portion protruding inwards. FIG. 10 shows a structure of a radio frequency apparatus in this embodiment. The radio frequency apparatus includes a package body in which an IC die (not shown) is packaged, and a patch element 19 is disposed on the surface of the package body. The IC die is electrically connected to the patch element 19 through the above-described RF trace. A surface of the package body is further provided with a plurality of solder balls 2b, the plurality of solder balls 2b and the patch element 19 are disposed on a surface of a same side of the package, and the plurality of solder balls 2b are arranged around the patch element 19. The package body is connected to a PCB board 3 through the plurality of solder balls 2b, the plurality of solder balls 2b is arranged around a circumference of a boundary of a waveguide aperture. The waveguide aperture 31 provided on the PCB board 3 has a same cross-sectional shape as an inner ring enclosed by the plurality of solder balls, and the PCB board 3 also has a ridge portion 32, as shown in FIG. 11.

In one embodiment, a signal transmitted from the IC die is transmitted to the patch element 19, and the patch element 19 then radiates the signal into a waveguide cavity formed by the plurality of solder balls 2b, and then the signal is transmitted into the waveguide aperture on the PCB board. The signal is further transmitted from the waveguide aperture into a waveguide cavity consist of a plurality of solder balls 2b, the waveguide cavity transmits the signal to the patch element 19, and the patch element 19 transmits the signal to the IC die.

In an exemplary example, one or more patch elements 19 may be provided on the surface of the package body, and each patch element 19 is connected to the IC die through the above-described RF trace; and, a ring of solder balls is arranged around each patch element 19, and a quantity of waveguide apertures on the PCB board also corresponds to the quantity of patch elements 19 in a one-to-one correspondence.

An embodiment of the present application further provides a radar apparatus, including at least: the radio frequency apparatus according to any one of the embodiments of the present application; an antenna structure. The antenna structure is connected with the waveguide aperture on the PCB board to achieve transmission of signals, wherein the antenna structure is preferably a waveguide antenna structure.

Although the embodiments disclosed herein are as described above, the contents described herein are the embodiments merely for the purpose of facilitating understanding of the present application, and are not intended to limit the present application. Any person skilled in the art to which this application belongs may make any modifications and changes in the form and details of implementation without departing from the essence and scope disclosed herein, but the patent protection scope of the present application must still be subject to the scope defined by the appended claims.

What is claimed is:

1. A conversion apparatus from a chip package to a waveguide, comprising: a first metal layer as a metal ground layer, a second metal layer, a third metal layer, a shielding metallization via, at least one conversion metallization via, and a dielectric substrate disposed between different metal layers to function as a support; wherein, the second metal layer is configured to lay a radio frequency (RF) trace;

the third metal layer is configured to dispose a patch element; a capacitance formed between the RF trace on the second metal layer and the patch element on the third metal layer introduces a capacitance characteristic;

a plurality of shielding metallization vias are ground vias around the patch element and the RF trace for guiding RF signal propagation; and the at least one conversion metallization via is disposed on one end of the RF trace close to the patch element, for connecting the RF trace and the patch element and introducing an inductance characteristic.

2. The conversion apparatus from the chip package to the waveguide according to claim 1, further comprising a connection structure connecting the chip package and a waveguide structure, wherein the connection structure encloses a waveguide cavity around the patch element; and an RF signal of a chip is converted into the waveguide structure through the radio frequency (RF) trace and the patch element and the waveguide cavity.

3. The conversion apparatus from the chip package to the waveguide according to claim 2, wherein the connection structure is a ball grid array (BGA) solder ball, or the connection structure is made of a material of which a surface is metal.

4. The conversion apparatus from the chip package to the waveguide according to claim 3, wherein the waveguide structure is provided with an inner cavity, and the inner cavity is rectangular, or elliptical, or circular, or ridge-shaped.

5. The conversion apparatus from the chip package to the waveguide according to claim 2, wherein the connection structure comprises a plurality of solder balls arranged around a circumference of the patch element, and the plurality of solder balls forms a waveguide cavity for the patch element to transmit a signal; and an inner ring enclosed by the plurality of solder balls comprises at least one ridge portion protruding inwards.

6. The conversion apparatus from the chip package to the waveguide according to claim 5, wherein the inner ring is a rectangular inner ring provided with the ridge portion within the inner.

7. The conversion apparatus from the chip package to the waveguide according to claim 6, wherein a quantity of the ridge portion is one; and the ridge portion is located in a middle of one side of the rectangular inner ring, or the ridge portion is located in a corner of the rectangular inner ring.

8. The conversion apparatus from the chip package to the waveguide according to claim 6, wherein a quantity of the ridge portions is two; and the two ridge portions are respectively located in middles of two opposite sides of the rectangular inner ring, or the two ridge portions are respectively located on two opposite corners of the rectangular inner ring.

9. The conversion apparatus from the chip package to the waveguide according to claim 1, wherein the RF trace is a substrate integrated waveguide (SIW), or a microstrip line, or a stripline, or a coplanar waveguide.

10. The conversion apparatus from the chip package to the waveguide according to claim 9, wherein the RF trace is a single branch trace or a multi-branch trace; and one end of each branch close to the patch element is provided with one of the at least one conversion metallization via.

11. The conversion apparatus from the chip package to the waveguide according to claim 10, wherein the RF trace is a single branch trace; and the single branch trace is a half Y-shaped single branch trace; or the RF trace is a multi-branch trace; and the multi-branch trace is a symmetrical fork-shaped three-branch trace.

12. The conversion apparatus from the chip package to the waveguide according to claim 1, wherein a projection of the RF trace on the third metal layer is at least partially overlapped with the patch element.

13. The conversion apparatus from the chip package to the waveguide according to claim 12, wherein an overlapping length of the projection of the RF trace on the third metal layer and the patch element is sufficiently long, to enable a resonance circuit formed by the capacitance formed between the RF trace and the patch element and an inductance introduced by the at least one conversion metallization via to constitute a broadband resonant structure.

14. The conversion apparatus from the chip package to the waveguide according to claim 13, wherein the overlapping length is greater than or equal to one third of a length of the patch element.

15. The conversion apparatus from the chip package to the waveguide according to claim 1, wherein the RF trace is symmetrically fed or asymmetrically fed.

16. The conversion apparatus from the chip package to the waveguide according to claim 1, wherein the patch element comprises a rectangular patch.

17. A radio frequency apparatus, comprising: a package body with an IC die, and a PCB board; wherein the package body further comprises the conversion apparatus from the chip package to the waveguide according to claim 1; and the PCB board is provided with a waveguide structure; and an RF signal from the IC die is converted into the waveguide structure through the patch element in the conversion apparatus.

18. The radio frequency apparatus according to claim 17, wherein a waveguide aperture is further provided on the PCB board corresponding to the patch element in the conversion apparatus, and signal transmission from the IC die to the waveguide aperture is implemented through the RF trace and the patch element in the conversion apparatus.

19. The radio frequency apparatus according to claim 18, wherein a cross-sectional shape of the waveguide aperture is the same as a shape of an inner ring enclosed by a plurality of solder balls around the patch element; and the package body is mounted on the PCB board, and a plurality of solder balls are arranged in a ring around a boundary of the waveguide aperture.

20. A radar apparatus, comprising: the radio frequency apparatus according to claim 17; and an antenna structure electrically connected to the radio frequency apparatus.

\* \* \* \* \*